US010096545B2

(12) United States Patent
Kawano et al.

(10) Patent No.: US 10,096,545 B2
(45) Date of Patent: Oct. 9, 2018

(54) SEMICONDUCTOR APPARATUS, SYSTEM, AND METHOD OF MANUFACTURING SEMICONDUCTOR APPARATUS

(71) Applicant: CANON KABUSHIKI KAISHA, Tokyo (JP)

(72) Inventors: Akihiro Kawano, Yokohama (JP); Tsutomu Tange, Yokohama (JP); Masao Ishioka, Oita (JP); Koichi Tazoe, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/279,135

(22) Filed: Sep. 28, 2016

(65) Prior Publication Data

US 2017/0092582 A1   Mar. 30, 2017

(30) Foreign Application Priority Data

Sep. 30, 2015 (JP) .................................. 2015-194479

(51) Int. Cl.
| | |
|---|---|
| *H01L 27/146* | (2006.01) |
| *H01L 23/522* | (2006.01) |
| *H01L 27/092* | (2006.01) |
| *H01L 29/78* | (2006.01) |
| *H01L 21/8238* | (2006.01) |

(52) U.S. Cl.
CPC .. *H01L 23/5226* (2013.01); *H01L 21/823814* (2013.01); *H01L 21/823878* (2013.01); *H01L 27/092* (2013.01); *H01L 27/14636* (2013.01); *H01L 27/14645* (2013.01); *H01L 29/7833* (2013.01)

(58) Field of Classification Search
None
See application file for complete search history.

(56) References Cited

U.S. PATENT DOCUMENTS 5,985,756 A * 11/1999 Shinmura ......... H01L 21/76843
257/E21.584
7,342,269 B1 * 3/2008 Yuzurihara ....... H01L 27/14609
257/291

(Continued)

FOREIGN PATENT DOCUMENTS

JP    2001-111022 A    4/2001
JP    2001-142224 A    5/2001

(Continued)

OTHER PUBLICATIONS

Machine generated english translation of JP2008282914.*

*Primary Examiner* — Charles Garber
*Assistant Examiner* — Xiaoming Liu
(74) *Attorney, Agent, or Firm* — Canon U.S.A Inc., IP Division

(57) ABSTRACT

There is provided an image capturing apparatus including a pixel circuit that generates a pixel signal based on an electric charge generated by photoelectric conversion and a logic circuit that outputs a signal based on the pixel signal. The image capturing apparatus includes a first contact plug connected to a source or a drain of a first transistor constituting the pixel circuit and a second contact plug connected to a source or a drain of a second transistor constituting the logic circuit. A diameter of the first contact plug is smaller than a diameter of the second contact plug.

19 Claims, 7 Drawing Sheets

(56) References Cited

U.S. PATENT DOCUMENTS

| | | | |
|---|---|---|---|
| 2005/0230712 A1* | 10/2005 | Michimata | H01L 21/28518 |
| | | | 257/211 |
| 2010/0230728 A1 | 9/2010 | Okagawa et al. | |
| 2010/0330723 A1 | 12/2010 | Okabe et al. | |
| 2011/0244627 A1 | 10/2011 | Okabe et al. | |
| 2013/0087838 A1* | 4/2013 | Mishima | H01L 27/1462 |
| | | | 257/291 |
| 2015/0214269 A1 | 7/2015 | Endo | |

FOREIGN PATENT DOCUMENTS

| | | | |
|---|---|---|---|
| JP | 2002-299571 A | | 10/2002 |
| JP | 2003-197889 A | | 7/2003 |
| JP | 2005-101557 A | | 4/2005 |
| JP | 2008-85304 A | | 4/2008 |
| JP | 2008-282914 A | | 11/2008 |
| JP | 2008282914 A | * | 11/2008 |
| JP | 2009-278049 A | | 11/2009 |
| JP | 2011-29604 A | | 2/2011 |
| JP | 2005-123576 A | | 11/2012 |
| JP | 2012-231148 A | | 11/2012 |
| JP | 2014-90051 A | | 5/2014 |
| JP | 2015-126114 A | | 7/2015 |

\* cited by examiner

SEMICONDUCTOR APPARATUS, SYSTEM, AND METHOD OF MANUFACTURING SEMICONDUCTOR APPARATUS

BACKGROUND OF THE INVENTION

Field of the Invention

The present technology relates to contact plugs of a semiconductor apparatus.

Description of the Related Art

In semiconductor apparatuses, contact plugs are used for connecting a transistor to wiring. A contact plug is formed by filling a contact hole with conductive material.

Japanese Patent Laid-Open No. 2008-282914 discloses the formation of a first contact hole with a first diameter and a second contact hole with a second diameter larger than the first diameter.

Japanese Patent Laid-Open No. 2011-29604 discloses that a first contact hole and a second contact hole are formed separately.

In image capturing apparatuses, a pixel circuit and a logic circuit are provided on a single substrate. Existing contact plugs have led to insufficiently enhanced performance of the pixel circuit and the logic circuit. Thus, the present technology provides a performance-enhanced semiconductor apparatus.

SUMMARY OF THE INVENTION

To solve the above-described issue, there is provided a semiconductor apparatus including a pixel circuit configured to generate a pixel signal based on an electric charge generated by photoelectric conversion and a logic circuit configured to output a signal based on the pixel signal. The semiconductor apparatus includes a first contact plug connected to a source or a drain of a first transistor constituting the pixel circuit and a second contact plug connected to a source or a drain of a second transistor constituting the logic circuit. A diameter of the first contact plug is smaller than a diameter of the second contact plug.

Further features of the present invention will become apparent from the following description of exemplary embodiments with reference to the attached drawings.

DESCRIPTION OF THE EMBODIMENTS

Figure 1A:
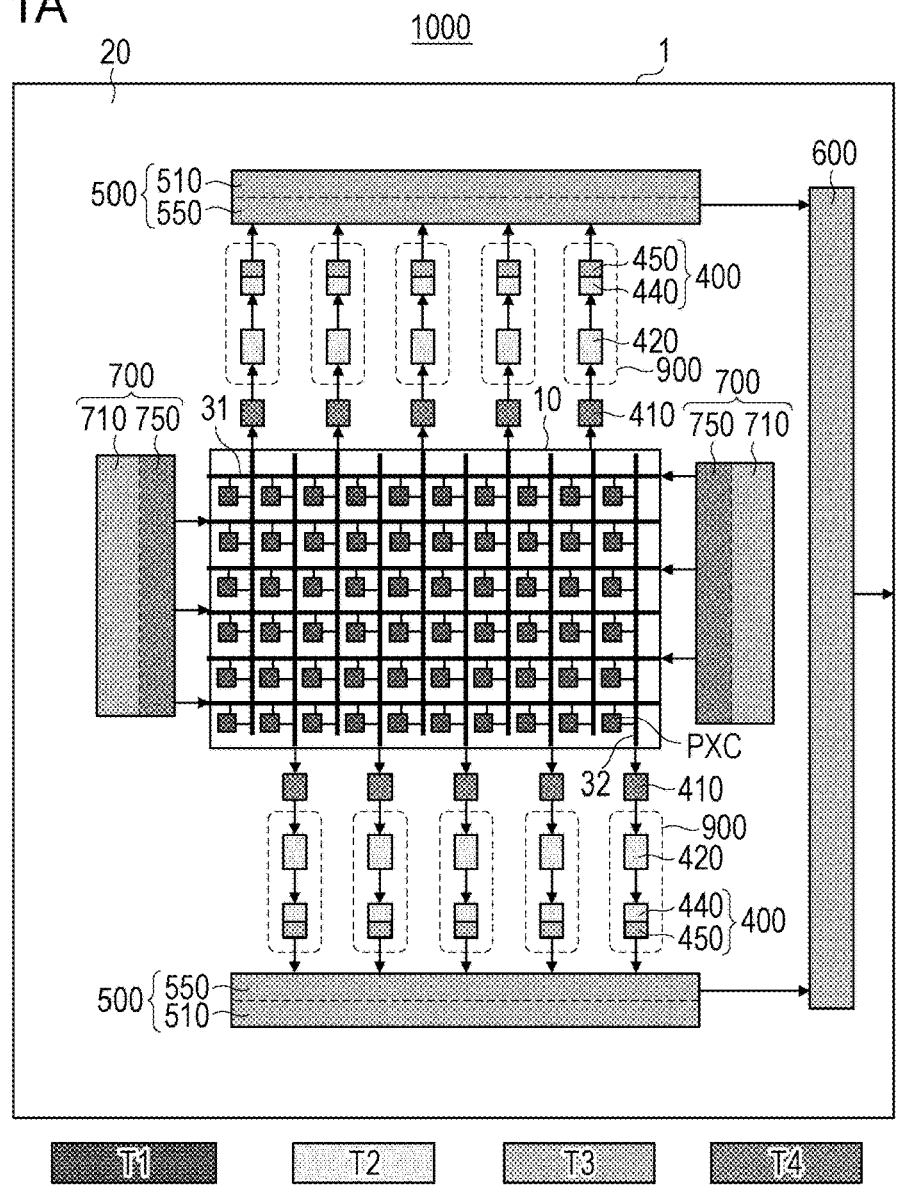
FIGS. 1A and 1B are each a schematic diagram illustrating an example of an image capturing apparatus.

An embodiment for implementing aspects of the present invention will be described below with reference to the drawings. In the following description and drawings, in some cases, a plurality of drawings are cross-referenced to each other. Components that are common to the plurality of drawings are denoted by identical reference numerals, and descriptions of the components denoted by the identical reference numerals are omitted where appropriate.

FIG. 1A is a circuit block diagram of an image capturing apparatus 1000 serving as an example of an embodiment. The image capturing apparatus 1000 includes a pixel circuit section 10 and a peripheral circuit section 20 on a single substrate 1.

The pixel circuit section 10 includes a plurality of pixel circuits PXCs that are arranged in a matrix. Pixel circuits PXCs of the same row are connected with a common row line 31. Pixel circuits PXCs of the same column are connected with a common column line 32.

The peripheral circuit section 20 includes a plurality of analog signal processing circuits 900 that are arranged for respective columns of the pixel circuits PXCs. In this example, groups of a plurality of analog signal processing circuits 900 are disposed above and below the pixel circuit section 10. However, the plurality of analog signal processing circuits 900 may be arranged only above or below the pixel circuit section 10. Each analog signal processing circuit 900 includes an amplifier circuit 420 and an analog-to-digital (AD) conversion circuit 400. The peripheral circuit section 20 can further include a plurality of readout circuits 410, horizontal output circuits 500, a digital signal processing circuit 600, vertical drive circuits 700, and a signal generation circuit. The components of the peripheral circuit section 20 are not limited to these, and any of these circuits may be omitted.

The plurality of readout circuits 410 are arranged for respective columns of the pixel circuits PXCs and connected to the pixel circuits PXCs via respective column lines 32. Each readout circuit 410 is connected to an analog signal processing circuit 900 corresponding to the same column of pixel circuits PXCs. The readout circuit 410 includes a current source and is connected to an amplifier transistor of a pixel circuit PXC to constitute a source follower circuit. The current source of the readout circuit 410 includes a current mirror circuit.

A function and operation of each circuit will be described. A scanning unit 710 of each vertical drive circuit 700 selects output units 750 sequentially to drive pixel circuits PXCs for each row. The scanning unit 710 is a register and is constituted by a logic circuit. A pixel circuit PXC operates on the basis of a signal from an output unit 750 of the vertical drive circuit 700 and generates a pixel signal corresponding to incident light. The pixel signal is read out from the pixel circuit PXC by operation of the readout circuit 410. A pixel signal is an analog signal. The pixel signal read out by the readout circuit 410 is subjected to signal processing by the analog signal processing circuit 900. Processes performed by the analog signal processing circuit 900 are a noise removal process using correlated double sampling or the like, and an amplification process. In the case where the analog signal processing circuit 900 includes the AD conversion circuit 400, an output signal from the analog signal processing circuit 900 is a digital signal. In the case where the analog signal processing circuit 900 does not include the AD conversion circuit 400, an output signal from the analog signal processing circuit 900 is an analog signal. The AD conversion circuit 400 includes an analog unit 440 and a digital unit 450. An analog signal is input to the analog unit 440, and a digital signal is output from the digital unit 450.

A digital signal output from the analog signal processing circuit 900 is read out by a memory unit 550 of a horizontal output circuit 500 and is retained in the memory unit 550. A scanning unit 510 of the horizontal output circuit 500 selects memory units 550 sequentially to output a signal retained in each memory unit 550 for each column. The scanning unit 510 is a register and is constituted by a logic circuit. The memory unit 550 is also constituted by a logic circuit. A digital signal output from the horizontal output circuit 500 is subjected to signal processing by the digital signal processing circuit 600. The digital signal processing circuit 600 performs a noise removal process and an arithmetic process, such as addition (subtraction), on a digital signal. The digital signal processing circuit 600 is constituted by a logic circuit, typically by a logic circuit including a complementary metal oxide semiconductor (CMOS) circuit.

The image capturing apparatus 1000 includes the single substrate 1 on which the pixel circuit section 10 and the peripheral circuit section 20 are provided. Additionally, the image capturing apparatus 1000 can include a housing (package) that houses the substrate 1.

An image capturing system can be constructed with the image capturing apparatus 1000. The image capturing system can include an optical system for guiding light to the image capturing apparatus 1000. The image capturing system can include a signal processing device that processes a signal output from the image capturing apparatus 1000. The image capturing system can include a display device that displays an image obtained by the image capturing apparatus 1000. Although the image capturing system is typically a camera, such as a video camera or still camera, the image capturing system may be an information terminal including a camera function, or a surveillance camera system in which an image capturing apparatus and a display device are installed in different places.

Figure 1B:
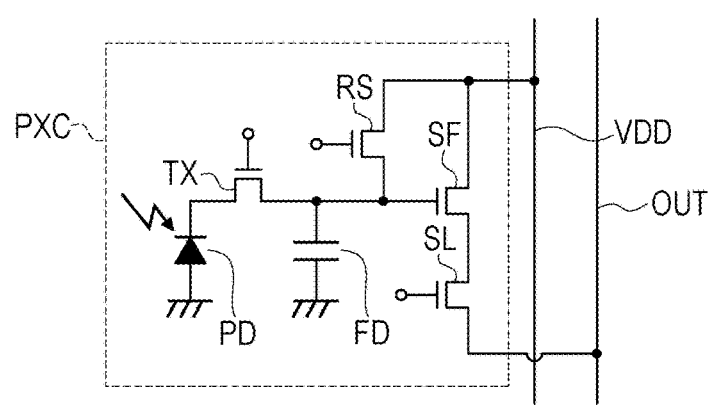

FIG. 1B illustrates an example of a circuit configuration of one pixel circuit PXC in the pixel circuit section 10. The pixel circuit PXC is constituted by a plurality of transistors. Here, a transfer transistor TX, an amplifier transistor SF, a selection transistor SL, and a reset transistor RS are insulated-gate field-effect transistors. The insulated-gate field-effect transistors are typically metal-oxide-semiconductor (MOS) transistors. The transistors other than the transfer transistor TX that are disposed in the pixel circuit PXC are collectively referred to as pixel transistors PXs. In this example, the transfer transistor TX and all the pixel transistors PXs are N-type MOS transistors. However, the pixel circuit PXC can be constituted by both N-type MOS transistors and P-type MOS transistors, or only by P-type MOS transistors. At least one of the transistors constituting the pixel circuit PXC may be a transistor, such as a junction field-effect transistor (JFET) or bipolar transistor, other than a MOS transistor.

A gate of the transfer transistor TX functions as an electric charge transfer portion that transfers a signal electric charge generated in a photoelectric conversion portion PD to an electric charge detection portion FD. The photoelectric conversion portion PD is composed of a photodiode and functions as a source of the transfer transistor TX. The electric charge detection portion FD is composed of a floating diffusion (floating diffusion region) and functions as a drain of the transfer transistor TX. The electric charge detection portion FD is connected to a gate of the amplifier transistor SF, a power supply line VDD is connected to a drain of the amplifier transistor SF, and an output line OUT is connected to a source of the amplifier transistor SF. The amplifier transistor SF constitutes a source follower circuit and outputs a signal corresponding to an electric potential of the electric charge detection portion FD to the output line OUT. The selection transistor SL performs ON/OFF switching of output from the pixel circuit PXC, and the reset transistor RS resets the electric potential of the electric charge detection portion FD to a reset potential. In this example, an electric potential supplied from the power supply line VDD is used as a reset potential. In addition to the transfer transistor TX, the amplifier transistor SF, and the reset transistor RS, a switch transistor that performs capacitance switching of the electric charge detection portion FD can be included. Furthermore, part of the signal processing circuit disposed for each column of the pixel circuits PXCs may be incorporated into each pixel circuit PXC.

Figure 2A:
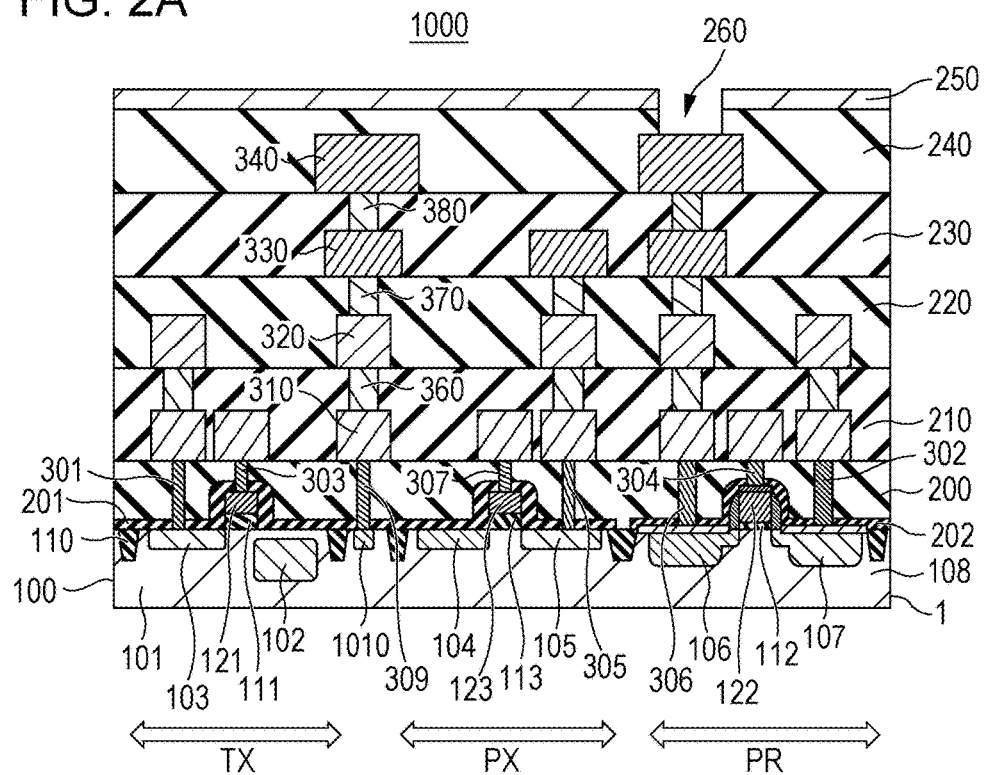
FIGS. 2A and 2B are each a schematic diagram illustrating an example of the image capturing apparatus.
Figure 2B:
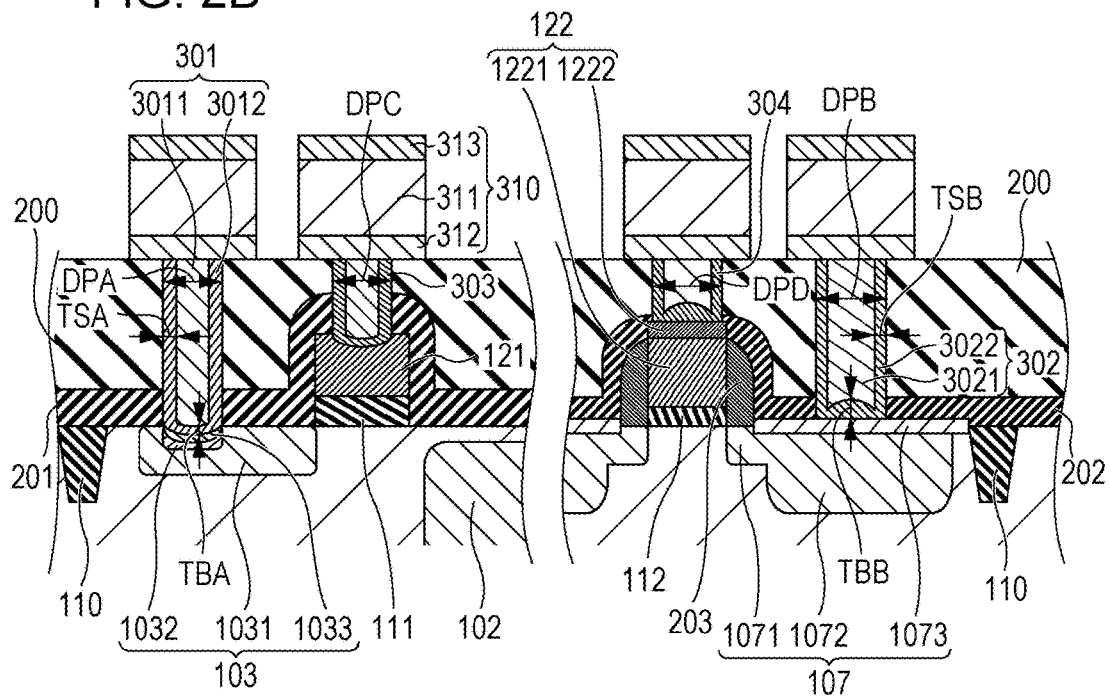

FIG. 2A illustrates a cross section including the transfer transistor TX and a pixel transistor PX in the pixel circuit section 10 and a cross section including a peripheral transistor PR in the peripheral circuit section 20. In this example, although the amplifier transistor SF in the pixel circuit PXC is illustrated as the pixel transistor PX, the same goes for the other pixel transistors. The peripheral transistor PR can be included in a CMOS circuit constituting a logic circuit. The peripheral transistor PR illustrated herein is an NMOS transistor in the CMOS circuit. FIG. 2B is an enlarged view of parts of the transfer transistor TX and the peripheral transistor PR that are illustrated in FIG. 2A.

The above-described substrate 1 includes a semiconductor layer 100. The semiconductor layer 100 is, for example, a single-crystal silicon layer epitaxially grown on a base included in the substrate 1. In the semiconductor layer 100, there is provided a well whose conductive type is based on a conductive type of a transistor. Here, there is illustrated a P-type semiconductor region 101 serving as a well for the N-type transistors in the pixel circuit section 10. Furthermore, in the pixel circuit section 10, there is also provided a P-type semiconductor region 1010 for supplying a reference potential (well potential) to the semiconductor region 101, and the semiconductor region 1010 has an impurity concentration higher than that of the semiconductor region 101. In the peripheral circuit section 20, there are provided a P-type semiconductor region 108 serving as a well for the N-type transistor and an N-type semiconductor region (not illustrated) serving as a well for a P-type transistor.

Insulating materials 110 for element isolation serving as element isolation regions for demarcating element regions (active regions) in the semiconductor layer 100 are disposed in trenches formed in the semiconductor layer 100. Thus, although the element isolation regions in this example have a shallow trench isolation (STI) structure, a local oxidation of silicon (LOCOS) structure may be adopted, or a P-N junction isolation structure may be adopted without using an insulating material.

In the pixel circuit section 10, a source 102 of the transfer transistor TX and a drain 103 of the transfer transistor TX are provided in the semiconductor layer 100. The source 102 functions as the photoelectric conversion portion PD and the drain 103 functions as the electric charge detection portion FD. A gate electrode 121 of the transfer transistor TX is provided over a channel region between the source 102 and the drain 103 with a gate insulating film 111 interposed between the gate electrode 121 and the channel region. A gate of the transfer transistor TX has a MOS structure composed of the gate electrode 121, the gate insulating film 111, and the semiconductor layer 100 (channel region).

Also, a source 104 of the pixel transistor PX and a drain 105 of the pixel transistor PX are provided in the semiconductor layer 100. Over the semiconductor layer 100, a gate electrode 123 of the pixel transistor PX is provided over a channel region between the source 104 and the drain 105 with a gate insulating film 113 interposed between the gate electrode 123 and the channel region. A gate of the pixel transistor PX has a MOS structure composed of the gate electrode 123, the gate insulating film 113, and the semiconductor layer 100 (channel region).

In the peripheral circuit section 20, a source 106 of the peripheral transistor PR and a drain 107 of the peripheral transistor PR are provided in the semiconductor layer 100. Over the semiconductor layer 100, a gate electrode 122 of the peripheral transistor PR is provided over a channel region between the source 106 and the drain 107 with a gate insulating film 112 interposed between the gate electrode 122 and the channel region. A gate of the peripheral transistor PR has a MOS structure composed of the gate electrode 122, the gate insulating film 112, and the semiconductor layer 100 (channel region).

Over the semiconductor layer 100, an interlayer insulating film 200 is provided in such a manner as to extend from the pixel circuit section 10 to the peripheral circuit section 20. In the pixel circuit section 10, an insulating film 201 covering the transfer transistor TX and the pixel transistor PX is provided between the semiconductor layer 100 and the interlayer insulating film 200. In the peripheral circuit section 20, an insulating film 202 covering the peripheral transistor PR is provided between the semiconductor layer 100 and the interlayer insulating film 200. Although the insulating film 202 does not cover the transfer transistor TX and the pixel transistor PX, the insulating film 201 and the insulating film 202 may overlap each other.

In the pixel circuit section 10, contact plugs 301, 303, 305, 307, and 309 are provided in such a manner as to extend through the interlayer insulating film 200 and the insulating film 201. Among these contact plugs, the contact plug 301 is connected to the drain 103 of the transfer transistor TX, and the contact plug 305 is connected to the drain 105 of the pixel transistor PX. The contact plug 303 is connected to the gate electrode 121 of the transfer transistor TX, and the contact plug 307 is connected to the gate electrode 123 of the pixel transistor PX. The contact plug 309 is connected to the semiconductor region 1010.

In the peripheral circuit section 20, contact plugs 302, 304, and 306 are provided in such a manner as to extend through the interlayer insulating film 200 and the insulating film 202. Among these contact plugs, the contact plug 302 is connected to the drain 107 of the peripheral transistor PR, and the contact plug 306 is connected to the source 106 of the peripheral transistor PR. The contact plug 304 is connected to the gate electrode 122 of the peripheral transistor PR.

On the interlayer insulating film 200, there is provided a first conductive layer 310 including a plurality of conductive patterns connected to the respective contact plugs. Over the first conductive layer 310, there is provided a second conductive layer 320 with an interlayer insulating film 210 interposed between the first conductive layer 310 and the second conductive layer 320. The first conductive layer 310 and the second conductive layer 320 are connected to each other with via plugs 360. Similarly, on the second conductive layer 320, there are provided an interlayer insulating film 220, via plugs 370, a third conductive layer 330, an interlayer insulating film 230, via plugs 380, and a fourth conductive layer 340. Over the fourth conductive layer 340, there is provided a passivation film 250 with an insulating film 240 for planarization interposed between the fourth conductive layer 340 and the passivation film 250. In the pixel circuit section 10, at least part of a conductive pattern of the fourth conductive layer 340 is used as a grid-like light shielding member. In the peripheral circuit section 20, at least part of a conductive pattern of the fourth conductive layer 340 is used as a pad electrode for input and output to and from the outside. In the insulating film 240 and the passivation film 250, an opening 260 is provided on the pad electrode.

Over the passivation film 250, a color filter array and a microlens array can be formed, when necessary, to constitute a front-illuminated solid-state image capturing apparatus. Additionally, of the semiconductor layer 100, on a side opposite to a plurality of wiring layers, a color filter array and a microlens array can be provided to constitute a back-illuminated solid-state image capturing apparatus.

As described above, the image capturing apparatus 1000 according to the embodiment is the image capturing apparatus 1000 including, on the single substrate 1, a pixel circuit PXC that generates a pixel signal based on an electric charge generated by photoelectric conversion and a logic circuit LGC that outputs a signal based on the pixel signal. As described below, the diameter of a contact plug connected to a source or drain of a transistor constituting the pixel circuit PXC is smaller than the diameter of a contact plug connected to a source or drain of a transistor constituting the logic circuit LGC. This can provide an image capturing apparatus in which a pixel circuit and a logic circuit have been enhanced in performance. Note that the term "diameter" used herein refers to the diameter of an inscribed circle of a horizontal cross-sectional shape of a contact plug or contact hole.

A reduction in the diameter of a contact plug connected to a source or drain of a transistor constituting the pixel circuit PXC reduces the area for contact, thus enabling a reduction in noise, such as dark current. Furthermore, a relative reduction in the diameter of a contact plug connected to a source or drain of a transistor constituting the pixel circuit PXC can make the transistor of the pixel circuit PXC finer. As a result, the area and volume of the photoelectric conversion portion PD can be increased, thereby enhancing the sensitivity, or the number of transistors of the pixel circuit PXC can be increased, thereby making the pixel circuit PXC more sophisticated in functionality.

On the other hand, an increase in the diameter of a contact plug connected to a source or drain of a transistor constituting the logic circuit LGC can increase the operating speed of the transistor constituting the logic circuit LGC. With respect to an operating speed in the logic circuit LGC, switching times (delay time, rise time, fall time, and accumulation time) are dominant. As a transistor becomes finer, the speed can be increased because of a reduction in channel length, whereas, as wiring also becomes finer simultaneously, a delay dependent on a time constant based on the product of wiring capacitance and wiring resistance becomes dominant. In the embodiment, an increase in the diameter of a contact plug reduces wiring resistance and thus can increase the operating speed of a transistor of the logic circuit LGC.

The diameter of a contact plug will be described in detail below. FIG. 2B is an enlarged view of parts of the transfer transistor TX and the peripheral transistor PR that are illustrated in FIG. 2A.

FIG. 2B illustrates a diameter DPA of the contact plug 301 and a diameter DPB of the contact plug 302. The diameter DPA is smaller than the diameter DPB (DPA<DPB). The diameter DPB of the contact plug 302 is typically not less than 1.30 times the diameter DPA of the contact plug 301. For example, the diameter DPB of the contact plug 302 is not less than 1.50 times and not more than 2.00 times the diameter DPA of the contact plug 301. Furthermore, the diameter DPA of the contact plug 301 is typically not less than 50 nm and is less than 200 nm. For example, the diameter DPA is not less than 130 nm and not more than 170 nm. The diameter DPB of the contact plug 302 is not less than 200 nm and not more than 300 nm. For example, the diameter DPB is not less than 210 nm and not more than 250 nm. These ranges are suitable for enhancing the performance of a pixel circuit and a logic circuit.

The contact plug 301 is provided in a contact hole extending through the interlayer insulating film 200 and the insulating film 201. The contact hole has a side (side face) composed of the interlayer insulating film 200 and the insulating film 201 and a bottom (bottom face) composed of the drain 103. The contact plug 301 includes a conductive portion 3011 made of tungsten and a barrier metal portion 3012 made of titanium and/or a titanium nitride. The barrier metal portion 3012 includes a side portion interposed between the side (interlayer insulating film 200, insulating film 201) of the contact hole and the conductive portion 3011, and a bottom portion interposed between the bottom (drain 103) of the contact hole and the conductive portion 3011.

Similarly, the contact plug 302 is provided in a contact hole extending through the interlayer insulating film 200 and the insulating film 202. The contact hole has a side (side face) composed of the interlayer insulating film 200 and the insulating film 202 and a bottom (bottom face) composed of the drain 107. The contact plug 302 includes a conductive portion 3021 made of tungsten and a barrier metal portion 3022 made of titanium and/or a titanium nitride. The barrier metal portion 3022 includes a side portion interposed between the side (interlayer insulating film 200, insulating film 202) of the contact hole and the conductive portion 3021, and a bottom portion interposed between the bottom (drain 107) of the contact hole and the conductive portion 3021.

The diameter DPA of the contact plug 301 and the diameter DPB of the contact plug 302 can be equal to the respective diameters of the contact holes in which the respective contact plugs are disposed. Note that, if an insulating film is applied to the inner wall of a contact hole, the diameter of a corresponding contact plug is smaller than the diameter of the contact hole.

A diameter DPC of the contact plug 303 connected to the gate electrode 121 of the transfer transistor TX can be not less than 0.80 times and be less than 1.30 times the diameter DPA of the contact plug 301. The diameter DPC can be made equal to the diameter DPA. Since the diameter DPC of the contact plug 303 is smaller than the size of the gate electrode 121, a reduction in the diameter DPC does not contribute to a finer pixel circuit PXC as significantly as a reduction in the diameter DPA. Then, in view of enhancing yields, it is also advisable to make the diameter DPC larger than the diameter DPA (DPC>DPA).

A diameter DPD of the contact plug 304 connected to the gate electrode 122 of the peripheral transistor PR is not less than 0.80 times and is less than 1.30 times the diameter DPB of the contact plug 302. The diameter DPD can be made equal to the diameter DPB (DPB=DPD). However, when the diameter DPD is made larger than the diameter DPB (DPD>DPB), the resistance of the contact plug 304 can be reduced and gate delay can also be reduced.

FIG. 2B illustrates, in the contact plug 301, a thickness TBA of the bottom portion of the barrier metal portion 3012 and a thickness TSA of the side portion of the barrier metal portion 3012. Furthermore, FIG. 2B illustrates, in the contact plug 302, a thickness TBB of the bottom portion of the barrier metal portion 3022 and a thickness TSB of the side portion of the barrier metal portion 3022. The thickness TSA is almost equal to the thickness TBA, and a ratio of the thickness TBA to the thickness TSA is almost 1 (TBA/TSA≈1). On the other hand, the thickness TBB is larger than the thickness TSB, and a ratio of the thickness TBB to the thickness TSB is larger than 1 (TBB/TSB>1). Thus, it is advisable that the ratio of the thickness TBA to the thickness TSA is smaller than the ratio of the thickness TBB to the thickness TSB (TBA/TSA<TBB/TSB). Such a relationship can reduce the occurrence of noise, such as dark current or random noise, in a pixel circuit and increase an operating speed in a logic circuit.

The thickness TBB of the bottom portion of the barrier metal portion 3022 can be made larger than the thickness TBA of the bottom portion of the barrier metal portion 3012 (TBB>TBA). For example, the thickness TBA is not less than 10 nm and is less than 50 nm. The thickness TBB is not less than 50 nm and not more than 150 nm. In the case where the barrier metal portion 3012 and the barrier metal portion 3022 each have a laminated structure of a titanium layer and a titanium nitride layer, the titanium nitride layer is positioned on conductive portion 3011 and 3021 sides, and the titanium layer is positioned on side and bottom surface sides of the contact holes. In the barrier metal portion 3012, the titanium layer can be made thicker than the titanium nitride layer. In the barrier metal portion 3022, the titanium layer can be made thinner than the titanium nitride layer. For example, in the barrier metal portion 3012, the titanium layer is not less than 9 nm and not more than 12 nm, and the titanium nitride layer is not less than 7 nm and not more than 9 nm. For example, in the barrier metal portion 3022, the titanium layer is not less than 10 nm and not more than 50 nm, and the titanium nitride layer is not less than 40 nm and not more than 80 nm.

Furthermore, in the pixel circuit section 10, the diameter of another contact plug connected to a source or drain of a transistor, for example, the diameter of the contact plug 305 can be made equal to the diameter DPA of the contact plug 301. In the peripheral circuit section 20, the diameter of another contact plug connected to a source or drain of a transistor can be made equal to the diameter DPB of the contact plug 302. In the pixel circuit section 10, the diameter of another contact plug connected to a gate of a transistor, for example, the diameter of the contact plug 307 can be made equal to the diameter DPC of the contact plug 303. In the peripheral circuit section 20, the diameter of another contact plug connected to a gate of a transistor can be made equal to the diameter DPD of the contact plug 304. The above-described configuration in which a contact plug includes a conductive portion and a barrier metal portion also goes for other contact plugs in the pixel circuit section 10 and the peripheral circuit section 20. Then, in the pixel circuit section 10, the relationship between the thickness of a side portion and the thickness of a bottom portion of a barrier metal portion of a contact plug other than the contact plug 301 can be the same as that in the contact plug 301. In the peripheral circuit section 20, the relationship between the thickness of a side portion and the thickness of a bottom portion of a barrier metal portion of a contact plug other than the contact plug 302 can also be the same as that in the contact plug 302. Furthermore, the diameter of the contact plug 309 in the pixel circuit section 10 can be made equal to the diameter DPA of the contact plug 301. The diameters of all contact plugs in the pixel circuit section 10 can be made smaller than at least one of the diameter DPB and the diameter DPD. In the embodiment, the diameter of at least one contact plug connected to a source or drain of a transistor of the pixel circuit PXC is smaller than the diameter of a contact plug connected to a source or drain of a transistor of the logic circuit LGC.

Note that the contact plug 301 and the contact plug 307 can be combined into one thick shared contact-type contact plug. In this case, the diameter of the shared contact-type contact plug may be larger than at least one of the diameter DPB of the contact plug 302 and the diameter DPD of the contact plug 304 in the peripheral circuit section 20. For example, when a shared contact-type contact plug with a diameter larger than the diameter DPB or the diameter DPD is used and a contact plug with a diameter smaller than the diameter DPB or the diameter DPD is simultaneously connected to a source or drain of the pixel transistor PX, the performance of the pixel circuit PXC can be enhanced. For a shared contact-type contact plug, Japanese Patent Laid-Open No. 2008-85304 can be consulted.

Furthermore, a difference between the transistor to which the contact plug 301 is connected and the transistor to which the contact plug 302 is connected will be described.

As illustrated in FIG. 2B, the thickness of the gate insulating film 111 is larger than the thickness of the gate insulating film 112. Adoption of the thin gate insulating film 112 is advantageous for driving the peripheral transistor PR at high speed because gate capacitance can be reduced. On the other hand, adoption of the thick gate insulating film 111 is advantageous for enhancing transfer characteristics of the transfer transistor TX because a high voltage can be applied to the gate (withstand voltage is increased). The above-described relationship between the thicknesses of gate insulating films and the above-described relationship between the diameters of contact plugs are suitable for enhancing the performance of a pixel circuit and a logic circuit. Like the transfer transistor TX, the pixel transistor PX can also include the gate insulating film 113 that is thick. Like the peripheral transistor PR, a P-type peripheral transistor of the logic circuit LGC can also include a thin gate insulating film. The thicknesses of the gate insulating films 111 and 113 are typically not less than 5 nm and not more than 15 nm, for example, not less than 10 nm and not more than 13 nm. The thickness of the gate insulating film 112 is typically not less than 1 nm and not more than 5 nm, for example, not less than 3 nm and not more than 4 nm.

The gate insulating film 111 may be made of a material, such as a silicon oxynitride or hafnium oxide, whose dielectric constant is higher than that of a silicon oxide, and the same goes for the gate insulating film 112.

As illustrated in FIG. 2B, the drain 103 of the transfer transistor TX has a single drain structure, and the drain 107 of the peripheral transistor PR has a lightly doped drain (LDD) structure. No side wall spacer is provided on sides of the gate electrode 121 of the transfer transistor TX, whereas a side wall spacer 203 is provided on sides of the gate electrode 122 of the peripheral transistor PR. The drain 103 with the single drain structure is composed of a semiconductor region 1031 with a uniform impurity concentration, up to an edge of the gate electrode 121, except for the vicinity of the contact plug 301. On the other hand, the drain 107 with the LDD structure includes a semiconductor region 1071 with a low-impurity concentration under the side wall spacer 203. The drain 107 further includes a semiconductor region 1072 with a high-impurity concentration in a position farther away from the channel region than the semiconductor region 1071. The impurity concentration of the semiconductor region 1071 is lower than that of the semiconductor region 1072. Thus, adoption of a thin contact plug in a transistor with a single drain structure and adoption of a thick contact plug in a transistor with an LDD structure are also suitable for enhancing the performance of a pixel circuit and a logic circuit. Similarly, the pixel transistor PX of the pixel circuit PXC can also have a single drain structure. Similarly, the P-type peripheral transistor of the logic circuit LGC can also have an LDD structure.

As illustrated in FIG. 2B, the drain 107 of the peripheral transistor PR includes a silicide region 1073. The silicide region 1073 is made of a compound (metal silicide) of a metal and silicon. The metal is a metal, such as cobalt (Co) or nickel (Ni), other than tungsten (W) and titanium (Ti) contained in the contact plug 302. When the silicide region 1073 with a higher electrical conductivity than a semiconductor is interposed between the contact plug 302 and the semiconductor region 1072 to connect them, contact resistance can be reduced. The silicide region 1073 extends between the interlayer insulating film 200 (or the insulating film 202) and the semiconductor region 1072. Such a disposition enables an increase in the area of the silicide region 1073 with low resistance and thus enables a further reduction in contact resistance. Similarly, a source and a drain of the P-type peripheral transistor of the logic circuit LGC can also include a silicide region.

The gate electrode 122 includes a polysilicon region 1221 and a silicide region 1222. The silicide region 1222 is made of a compound (metal silicide) of a metal and silicon. The metal is a metal, such as cobalt (Co) or nickel (Ni), other than tungsten (W) and titanium (Ti) contained in the contact plug 304.

As illustrated in FIG. 2B, a semiconductor region 1032 is provided between the semiconductor region 1031 constituting the drain 103 of the transfer transistor TX and the contact plug 301. The impurity concentration of the semiconductor region 1032 is higher than that of the semiconductor region 1031. Furthermore, the impurity concentration of the semiconductor region 1032 is higher than that of the semiconductor region 1071. The impurity concentration of the semiconductor region 1032 may be lower than that of the semiconductor region 1072. The impurity concentration of the semiconductor region 1032 is not less than $1\times10^{19}$ atoms/cm$^3$ and not more than $5\times10^{20}$ atoms/cm$^3$, for example. The impurity concentration of the semiconductor region 1032 is typically not less than $3\times10^{19}$ atoms/cm$^3$ and not more than $3\times10^{20}$ atoms/cm$^3$. The impurity concentration of the semiconductor region 1071 is not less than $1\times10^{18}$ atoms/cm$^3$ and not more than $5\times10^{19}$ atoms/cm$^3$, for example. The impurity concentration of the semiconductor region 1071 is typically not less than $3\times10^{18}$ atoms/cm$^3$ and not more than $2\times10^{19}$ atoms/cm$^3$. When the semiconductor region 1032 with a high-impurity concentration is provided, contact resistance can be reduced. A silicide region 1033 is provided between the semiconductor region 1032 and the contact plug 301. The silicide region 1033 is made of a compound of a metal, such as tungsten (W) and/or titanium (Ti), contained in the contact plug 301 and silicon. When the silicide region 1033 with a higher electrical conductivity than a semiconductor is interposed between the contact plug 301 and the semiconductor regions 1031 and 1032 to connect them, contact resistance can be reduced. By not using an unnecessary metal that is not contained in the contact plug 301 for the silicide region 1033, dark current or a white defect can be reduced. The semiconductor region 1032 with a high-impurity concentration or the silicide region 1033 can be omitted.

The gate electrode 121 includes a polysilicon region. Like the silicide region 1033, a silicide region made of a compound of a metal contained in the contact plug 303 and silicon can be provided between the polysilicon region and the contact plug 303. An insulating member having the same shape as the upper surface of the gate electrode 121 may be provided between the gate electrode 121 and the insulating film 201. In this case, the contact plug 303 extends through the insulating member and connects to the gate electrode 121.

T1, T2, T3, and T4 illustrated in FIG. 1A denote the types of transistors included in each circuit. T1, T2, T3, and T4 are respectively referred to as a first-type transistor, a second-type transistor, a third-type transistor, and a fourth-type transistor. The diameter of a contact plug connected to a source or drain of the first-type transistor T1 can be the diameter DPA. The diameter of a contact plug connected to a gate of the first-type transistor T1 can be the diameter DPC. The diameters of contact plugs connected to sources or drains of the second-type, third-type, and fourth-type transistors T2, T3, and T4 can be the diameter DPB. The diameters of contact plugs connected to gates of the second-type, third-type, and fourth-type transistors T2, T3, and T4 can be the diameter DPD. The third-type transistor T3 can constitute a logic circuit. A gate insulating film of the third-type transistor T3 is thinner than that of the first-type transistor T1. A drive voltage of the third-type transistor T3 is lower than that of the first-type transistor T1. A drain current of the third-type transistor T3 is lower than that of the first-type transistor T1. The thickness of a gate insulating film, the level of a drive voltage, and the magnitude of a drain current of the second-type transistor T2 may be the same as or different from those of the third-type transistor T3. A circuit constituted by the fourth-type transistor T4 supplies voltage and current to pixel circuits PXCs. For example, the fourth-type transistor T4 constitutes a current source of a readout circuit 410. The diameter of the contact plug connected to the source or drain of the fourth-type transistor T4 can be made larger than the diameter DPA of a contact plug connected to a source or drain of a transistor of each pixel circuit PXC. The diameter of the contact plug connected to the gate of the fourth-type transistor T4 can be made larger than the diameter DPC of a contact plug connected to a gate of a transistor of the pixel circuit PXC.

Figure 3A:
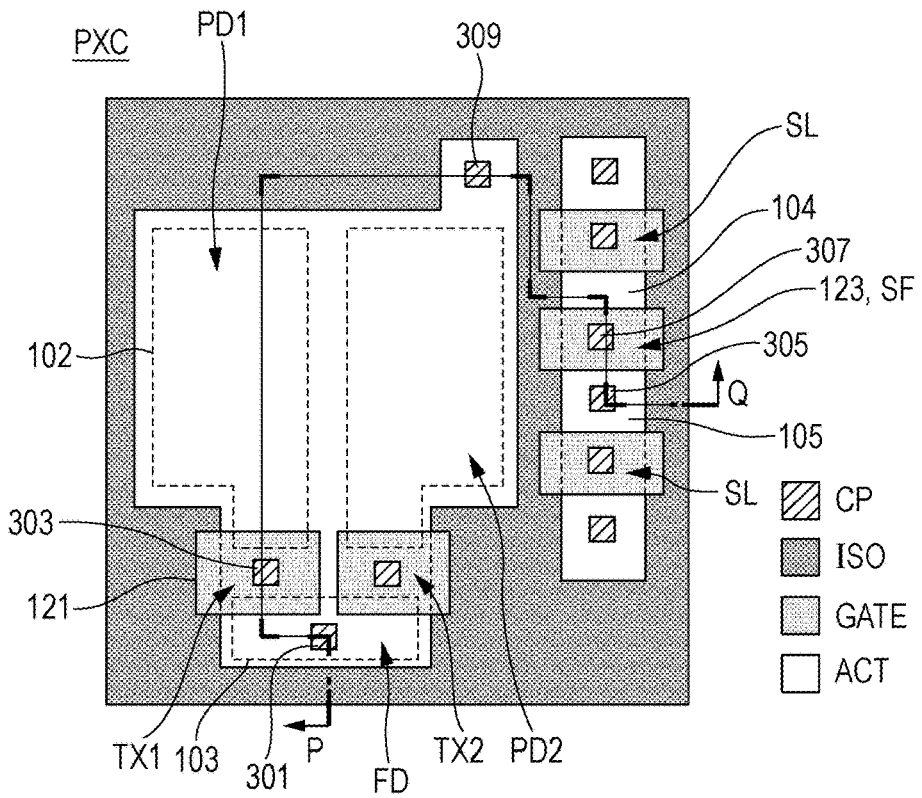
FIGS. 3A and 3B are each a schematic diagram illustrating an example of the image capturing apparatus.
Figure 3B:
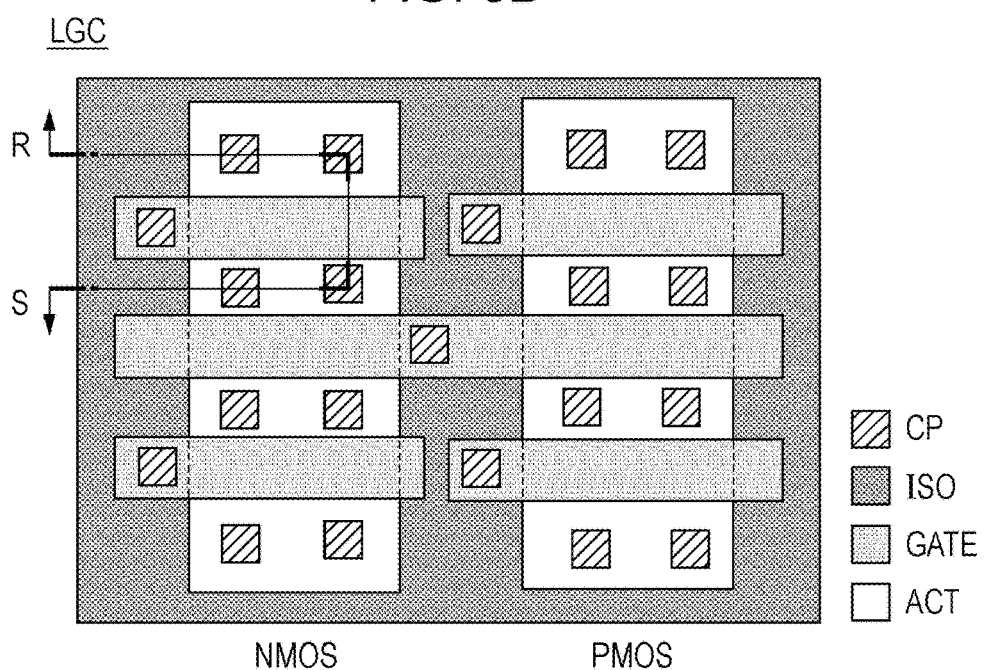

FIG. 3A illustrates an example of a layout of the pixel circuit PXC, and FIG. 3B illustrates an example of a layout of the logic circuit LGC. In FIGS. 3A and 3B, "CP" denotes a position of a contact plug, "ISO" denotes a position of an element isolation region, "GATE" denotes a position of a gate electrode, and "ACT" denotes a position of an element region. Note that, in FIG. 2A, the cross section of the pixel circuit section 10 is a cross section taken along line P-Q of FIG. 3A and the cross section of the peripheral circuit section 20 is a cross section taken along line R-S of FIG. 3B.

As illustrated in FIG. 3A, a contact plug connected to each gate electrode in the pixel circuit PXC is disposed over an element region, and the element region under the contact plug is a channel region. When a contact plug is disposed over a channel region in this way, the layout of the pixel circuit PXC can be made finer. In place of using this technique, a gate electrode can be caused to extend over an element isolation region and a contact plug can be disposed over a portion of the element isolation region over which the gate electrode extends. In this case, although the layout cannot be made finer, damage to a channel region is reduced, thereby enabling a reduction in noise. Adoption of a thin contact plug is advantageous to a finer layout because the amount by which a gate electrode extends over the element isolation region can be reduced even when the contact plug is disposed over the element isolation region.

In the pixel circuit PXC in this example, a photoelectric conversion portion includes a plurality of photoelectric conversion regions PD1 and PD2 that are isolated from each other by an isolation region. Then, electric charges of the photoelectric conversion regions PD1 and PD2 can be transferred to the electric charge detection portion FD at different points in time by a plurality of electric charge transfer portions TX1 and TX2 that are isolated from each other. This enables the pixel circuit PXC in this example to perform focus detection or distance measurement with a pupil-dividing phase difference detection method. In this example, although the electric charge transfer portions TX1 and TX2 are configured to transfer electric charges to the common electric charge detection portion FD, the electric charge transfer portions TX1 and TX2 can be configured to transfer electric charges to respective electric charge detection portions.

As illustrated in FIG. 3B, a plurality of contact plugs are disposed for one source or drain. At least one of the plurality of contact plugs, if possible, all of the contact plugs are thick contact plugs with the above-described diameter DPB. This is advisable because resistance to the source or drain can be further reduced. In other words, using a thick contact plug for a transistor in which a plurality of contact plugs are to be disposed for one source or drain is advantageous.

A thick contact plug can also be used in a peripheral circuit other than logic circuits in the peripheral circuit section 20 illustrated in FIG. 1A. Such a peripheral circuit other than the logic circuits is an analog circuit, and a larger current may flow than that in a transistor of a pixel circuit or logic circuit. It is advisable to use a thick contact plug with the diameter DPB for a transistor of this peripheral circuit because power consumption can be reduced. Furthermore, in a transistor of the logic circuit, a current simply flows during switching, and the amount of current that flows is smaller than that in a transistor of the pixel circuit.

Next, an example of a method of manufacturing the image capturing apparatus 1000 will be described. The image capturing apparatus 1000 is a type of semiconductor apparatus and can be manufactured by a typical CMOS process.

Figure 4A:
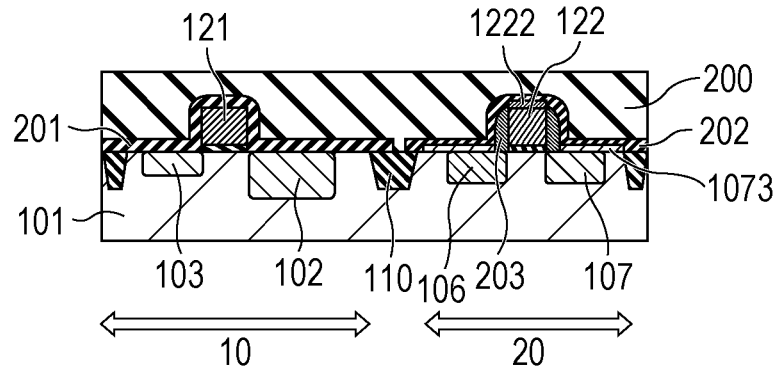
FIGS. 4A to 4I are schematic diagrams illustrating an example of a method of manufacturing the image capturing apparatus.

As illustrated in FIG. 4A, the transfer transistor TX and the pixel transistor PX (not illustrated) are formed in the pixel circuit section 10. In the pixel circuit section 10 in which the gate electrode 121 is formed and the peripheral circuit section 20 in which the gate electrode 122 is formed, a first silicon nitride film is formed. In the pixel circuit section 10, the insulating film 201 is formed from the first silicon nitride film. Part of the first silicon nitride film is left as the side wall spacer 203 of the peripheral transistor PR. The peripheral transistor PR is formed in the peripheral circuit section 20. In the peripheral transistor PR, a silicide region is formed by a self-aligned silicide (salicide) process. In the salicide process, the pixel transistor PX is protected by a silicide protection film, and no silicide region is formed in the transfer transistor TX and the pixel transistor PX (not illustrated). In the pixel circuit section 10 and the peripheral circuit section 20, a second silicon nitride film is formed, and the insulating film 202 is formed from the second silicon nitride film. The interlayer insulating film 200 covering the insulating films 201 and 202 is formed and is subjected to a planarization process by one of an etch back method, a reflow method, and a chemical-mechanical polishing (CMP) method, or by a combination of two or more of these methods.

Figure 4B:
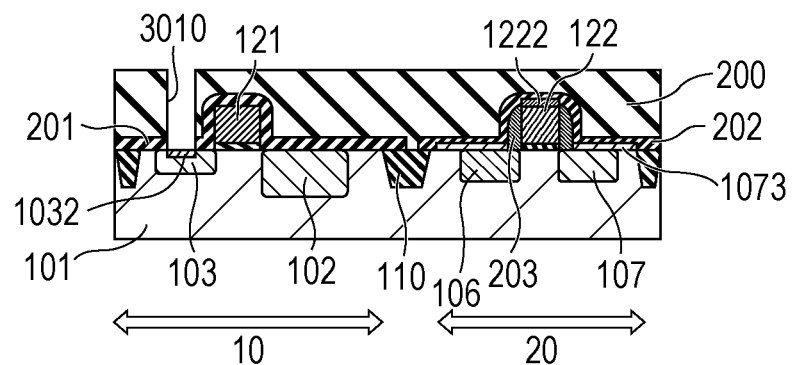

As illustrated in FIG. 4B, on the drain 103, the interlayer insulating film 200 and the insulating film 201 are etched to form a contact hole 3010. The contact hole 3010 may have a taper. Then, the drain 103 is ion-implanted with an impurity through the contact hole 3010 and thus the semiconductor region 1032 is formed. Subsequently, when the inside of the contact hole 3010 is wet-etched, the bottom of the contact hole 3010 presents a concave surface as illustrated in FIG. 2B.

Figure 4C:
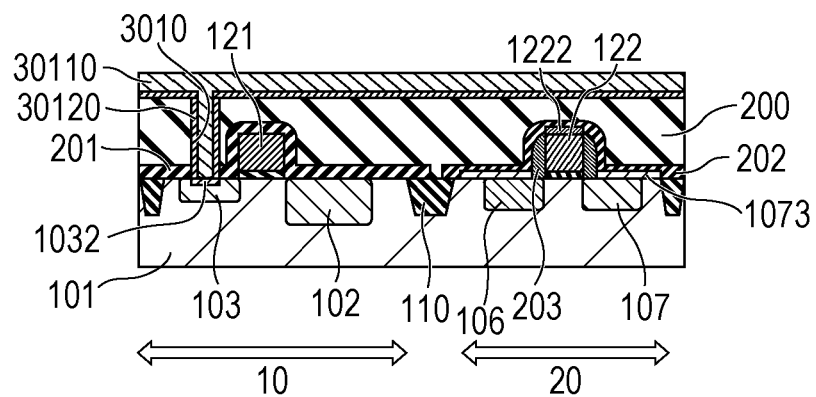

As illustrated in FIG. 4C, a barrier metal film 30120 that is a laminated film of a titanium layer and a titanium nitride layer is formed in the contact hole 3010, and then a conductive film 30110 that is a single-layer film of a tungsten layer is formed on the barrier metal film 30120. The barrier metal film 30120 is formed by a chemical vapor deposition (CVD) method. For example, the titanium layer of the barrier metal film 30120 can be formed by a plasma CVD method, and the titanium nitride layer can be formed on the titanium layer by a thermal CVD method. With respect to the material and thickness of the barrier metal film 30120, the conditions of the above-described barrier metal portion 3012 can be adopted. Of the barrier metal film 30120, the thickness of a portion formed on a top (top face) of the interlayer insulating film 200 is substantially equal to the thickness TBA of the bottom portion of the barrier metal portion 3012.

Figure 4D:
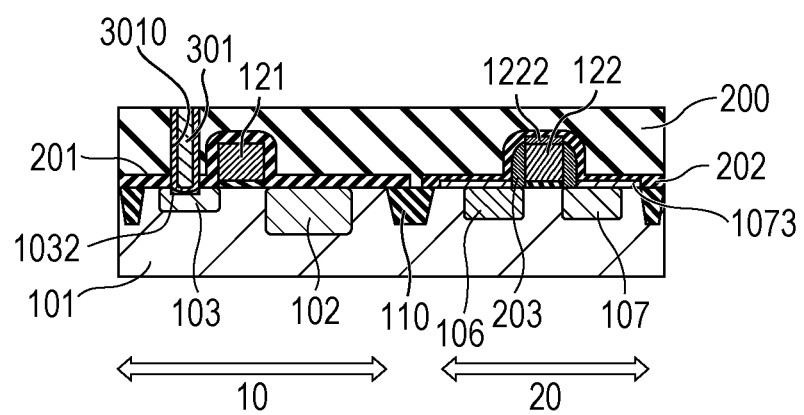

As illustrated in FIG. 4D, unnecessary portions of the conductive film 30110 and barrier metal film 30120 outside the contact hole 3010 are removed by the CMP method to form the contact plug 301.

Figure 4E:
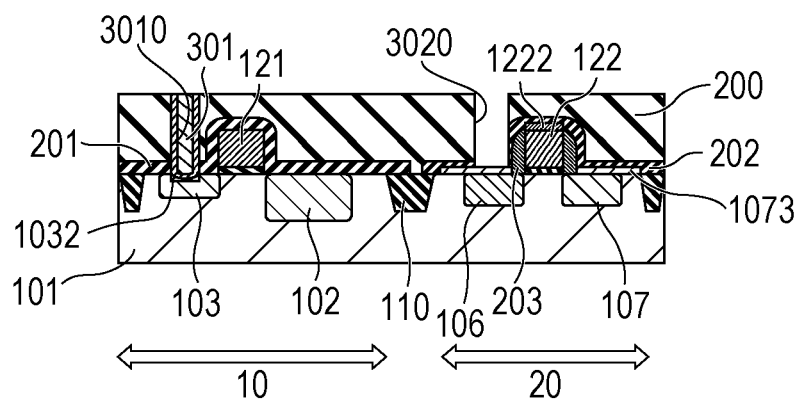

As illustrated in FIG. 4E, on the source 106, the interlayer insulating film 200 and the insulating film 202 are etched to form a contact hole 3020. The contact hole 3020 may have a taper and may be different from the contact hole 3010 in taper angle and taper shape.

Figure 4F:
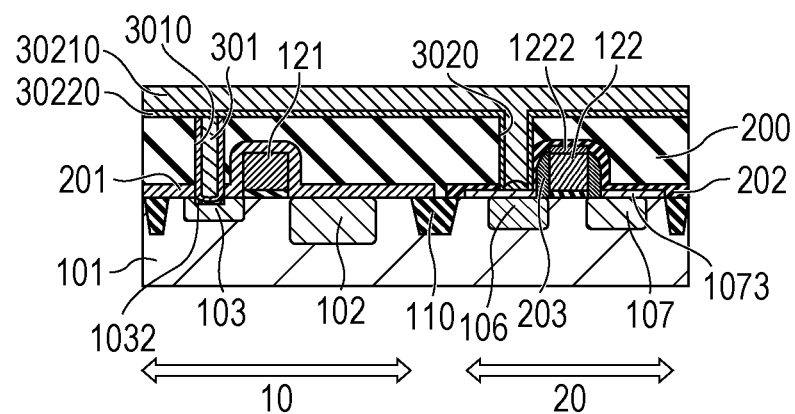

As illustrated in FIG. 4F, a barrier metal film 30220 that is a laminated film of a titanium layer and a titanium nitride layer is formed in the contact hole 3020, and then a conductive film 30210 that is a single-layer film of a tungsten layer is formed on the barrier metal film 30220. The barrier metal film 30220 is formed by a physical vapor deposition (PVD) method. For example, the titanium layer of the barrier metal film 30220 can be formed by a sputtering method, and the titanium nitride layer can be formed on the titanium layer by the sputtering method. With respect to the material and thickness of the barrier metal film 30220, the conditions of the above-described barrier metal portion 3022 can be adopted. Of the barrier metal film 30220, the thickness of a portion formed on a top (top face) of the interlayer insulating film 200 is substantially equal to the thickness TBB of the bottom portion of the barrier metal portion 3022.

Figure 4G:
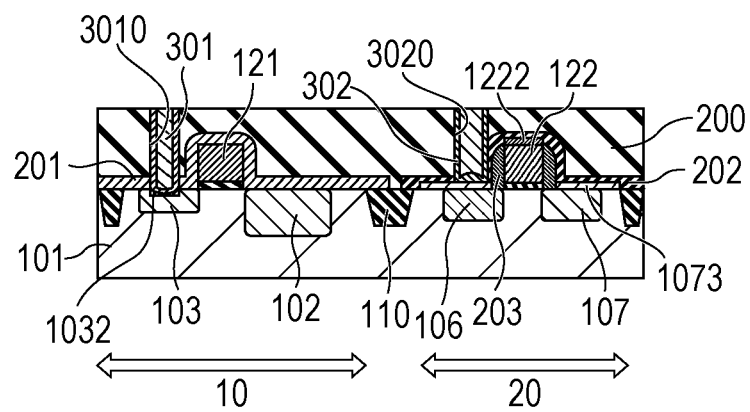

As illustrated in FIG. 4G, unnecessary portions of the conductive film 30210 and barrier metal film 30220 outside the contact hole 3020 are removed by the CMP method to form the contact plug 302.

Figure 4H:
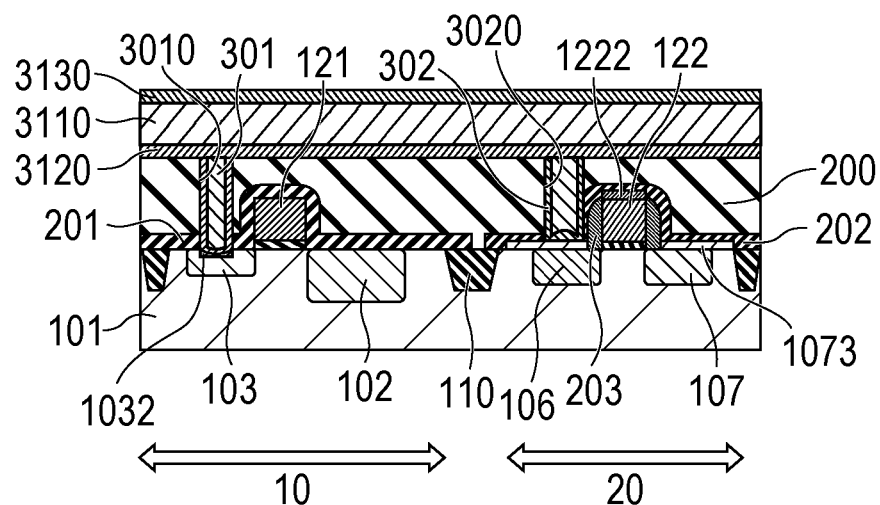

As illustrated in FIG. 4H, a barrier metal film 3120 that is a laminated film of a titanium layer and a titanium nitride layer is formed. Additionally, on the barrier metal film 3120, a conductive film 3110 that is a single-layer film of an aluminum layer is formed. Furthermore, on the conductive film 3110, a barrier metal film 3130 that is a single-layer film of a titanium nitride layer is formed.

Figure 4I:
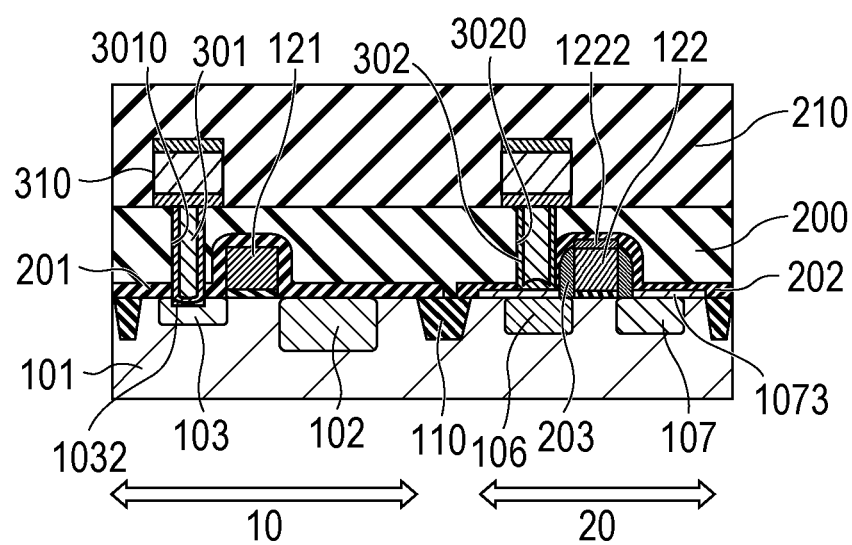

As illustrated in FIG. 4I, the barrier metal film 3120, the conductive film 3110, and the barrier metal film 3130 are patterned to form the first conductive layer 310 including a plurality of conductive patterns. The interlayer insulating film 210 is formed in such a manner as to cover the first conductive layer 310. Subsequent steps can be performed by using a multilayer wiring technique in the CMOS process.

In this example, although the contact plug 302 is formed after the contact plug 301 is formed, the contact plug 301 may be formed after the contact plug 302 is formed. Since film formation methods for the respective barrier metal films are different, the respective contact holes are filled with conductive material separately, whereas the contact holes 3010 and 3020 can be filled with conductive material simultaneously by a common film formation method. Furthermore, the contact holes 3010 and 3020 with different diameters can be formed simultaneously in common etching conditions.

The above-described embodiment can be appropriately varied without departing from the scope of the technical idea of one or more embodiments of the present invention.

According to one or more embodiments of the present invention, a performance-enhanced semiconductor apparatus can be provided.

While aspects of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-194479, filed Sep. 30, 2015, which is hereby incorporated by reference herein in its entirety.

What is claimed is:

1. A semiconductor apparatus comprising:
a first transistor;
a first contact plug connected to a source or a drain of the first transistor;
a second transistor;
a second contact plug connected to a source or a drain of the second transistor; and
a third contact plug connected to a gate of the second transistor,
wherein the first transistor constitutes a pixel circuit configured to generate a pixel signal based on an electric charge generated by photoelectric conversion,
wherein the second transistor constitutes a logic circuit configured to output a signal based on the pixel signal,
wherein a diameter of the first contact plug is smaller than a diameter of the second contact plug, and
wherein the diameter of the first contact plug is smaller than a diameter of the third contact plug.

2. The semiconductor apparatus according to claim 1, wherein the diameter of the second contact plug is not less than 1.30 times the diameter of the first contact plug.

3. The semiconductor apparatus according to claim 1, wherein the diameter of the second contact plug is not less than 1.50 times and not more than 2.00 times the diameter of the first contact plug.

4. The semiconductor apparatus according to claim 1, wherein the diameter of the first contact plug is not less than 50 nm and is less than 200 nm, and the diameter of the second contact plug is not less than 200 nm and not more than 300 nm.

5. The semiconductor apparatus according to claim 1, wherein a diameter of a fourth contact plug connected to a gate of the first transistor is less than 1.30 times the diameter of the first contact plug.

6. The semiconductor apparatus according to claim 1, wherein a fourth contact plug connected to a gate of the first transistor is positioned over a channel region of the first transistor.

7. The semiconductor apparatus according to claim 1, wherein a plurality of contact plugs including the second contact plug are connected to the drain of the second transistor.

8. The semiconductor apparatus according to claim 1, wherein the first transistor and the second transistor are insulated-gate field-effect transistors, and a gate insulating film of the first transistor is thicker than a gate insulating film of the second transistor.

9. The semiconductor apparatus according to claim 1, wherein a contact plug connected to a third transistor that is connected to the pixel circuit and constitutes a current source, has a diameter that is larger than the diameter of the first contact plug.

10. The semiconductor apparatus according to claim 1, wherein a second semiconductor region is provided between a first semiconductor region that constitutes the drain of the first transistor and the first contact plug, wherein a silicide region is provided between a third semiconductor region that constitutes the drain of the second transistor and the second contact plug, and wherein an impurity concentration of the second semiconductor region is higher than an impurity concentration of the first semiconductor region.

11. The semiconductor apparatus according to claim 1, wherein the first contact plug includes a first conductive portion disposed in a first contact hole having a side and a bottom, and a first barrier metal portion including a side portion interposed between the side of the first contact hole and the first conductive portion, and a bottom portion interposed between the bottom of the first contact hole and the first conductive portion of the first contact plug, wherein the second contact plug includes a second conductive portion disposed in a second contact hole having a side and a bottom, and a second barrier metal portion including a side portion interposed between the side of the second contact hole and the second conductive portion, and a bottom portion interposed between the bottom of the second contact hole and the second conductive portion, and wherein a ratio of a thickness of the bottom portion of the second barrier metal portion to a thickness of the side portion of the second barrier metal portion is larger than a ratio of a thickness of the bottom portion of the first barrier metal portion to a thickness of the side portion of the first barrier metal portion.

12. The semiconductor apparatus according to claim 1, wherein the drain of the first transistor has a single drain structure, and the drain of the second transistor has a lightly doped drain structure.

13. The semiconductor apparatus according to claim 1, wherein the first transistor is a transfer transistor configured to transfer the electric charge.

14. The semiconductor apparatus according to claim 1, wherein the second transistor is included in a complementary metal oxide semiconductor circuit.

15. A system comprising:
the semiconductor apparatus according to claim 1; and
a signal processing device configured to process a signal output from the semiconductor apparatus.

16. A semiconductor apparatus comprising:
a first transistor;
a first contact plug connected to the first transistor;
a second transistor; and
a second contact plug connected to the second transistor,
wherein the first contact plug includes a first conductive portion disposed in a first contact hole having a side and a bottom, and a first barrier metal portion including a side portion interposed between the side of the first contact hole and the first conductive portion, and a bottom portion interposed between the bottom of the first contact hole and the first conductive portion of the first contact plug,
wherein the second contact plug includes a second conductive portion disposed in a second contact hole having a side and a bottom, and a second barrier metal portion including a side portion interposed between the side of the second contact hole and the second conductive portion, and a bottom portion interposed between the bottom of the second contact hole and the second conductive portion,
wherein a ratio of a thickness of the bottom portion of the first barrier metal portion to a thickness of the side portion of the first barrier metal portion is smaller than a ratio of a thickness of the bottom portion of the second barrier metal portion to a thickness of the side portion of the second barrier metal portion, and
wherein the thickness of the bottom portion of the second barrier metal portion is larger than the thickness of the bottom portion of the first barrier metal portion.

17. The semiconductor apparatus according to claim 16, wherein the first transistor and the second transistor are insulated-gate field-effect transistors, and a thickness of a gate insulating film of the first transistor is different from a thickness of a gate insulating film of the second transistor.

18. The semiconductor apparatus according to claim 16, wherein a second semiconductor region is provided between a first semiconductor region that constitutes a drain of the first transistor and the first contact plug, wherein a silicide region is provided between a third semiconductor region that constitutes a drain of the second transistor and the second contact plug, and wherein an impurity concentration of the second semiconductor region is higher than an impurity concentration of the first semiconductor region.

19. A system comprising:
the semiconductor apparatus according to claim 16; and
a signal processing device configured to process a signal output from the semiconductor apparatus.

* * * * *